(12) United States Patent
Laksana et al.

(10) Patent No.: US 12,512,432 B2
(45) Date of Patent: Dec. 30, 2025

(54) DICING PROCESS IN PACKAGES COMPRISING ORGANIC INTERPOSERS

(71) Applicant: Taiwan Semiconductor Manufacturing Co., Ltd., Hsinchu (TW)

(72) Inventors: Chipta Priya Laksana, Taoyuan (TW); Chun-Lung Jao, Shuili Township (TW); Shu-Shen Yeh, Taoyuan (TW); Chien-Sheng Chen, Hsinchu (TW); Shin-Puu Jeng, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 772 days.

(21) Appl. No.: 17/654,907

(22) Filed: Mar. 15, 2022

(65) Prior Publication Data
US 2023/0023268 A1    Jan. 26, 2023

Related U.S. Application Data

(60) Provisional application No. 63/224,478, filed on Jul. 22, 2021.

(51) Int. Cl.
*H01L 23/00* (2006.01)
*H01L 21/48* (2006.01)
(Continued)

(52) U.S. Cl.
CPC .......... *H01L 24/19* (2013.01); *H01L 21/4857* (2013.01); *H01L 21/78* (2013.01);
(Continued)

(58) Field of Classification Search
CPC ..... H01L 24/19; H01L 21/4857; H01L 21/78; H01L 23/49816; H01L 23/5389;
(Continued)

(56) References Cited

U.S. PATENT DOCUMENTS

2005/0186762 A1* 8/2005 Senoo ............... H01L 21/78
438/464
2010/0140795 A1* 6/2010 Do .................... H01L 24/05
257/737

(Continued)

FOREIGN PATENT DOCUMENTS

TW         201906120 A     2/2019

*Primary Examiner* — Jacob Y Choi
*Assistant Examiner* — Neil R Prasad
(74) *Attorney, Agent, or Firm* — Slater Matsil, LLP

(57) ABSTRACT

A method includes forming an interconnect component including a plurality of dielectric layers that include an organic dielectric material, and a plurality of redistribution lines extending into the plurality of dielectric layers. The method further includes bonding a first package component and a second package component to the interconnect component, encapsulating the first package component and the second package component in an encapsulant, and precutting the interconnect component using a blade to form a trench. The trench penetrates through the interconnect component, and partially extends into the encapsulant. The method further includes performing a singulation process to separate the first package component and the second package component into a first package and a second package, respectively.

20 Claims, 20 Drawing Sheets

(51) Int. Cl.
  *H01L 21/78*  (2006.01)
  *H01L 23/498* (2006.01)
  *H01L 23/538* (2006.01)
  *H01L 25/11*  (2006.01)

(52) U.S. Cl.
  CPC .... *H01L 23/49816* (2013.01); *H01L 23/5389* (2013.01); *H01L 24/97* (2013.01); *H01L 25/117* (2013.01); *H01L 2224/04105* (2013.01); *H01L 2224/32225* (2013.01); *H01L 2225/1058* (2013.01); *H01L 2924/15311* (2013.01)

(58) Field of Classification Search
  CPC ................... H01L 24/97; H01L 25/117; H01L 2224/04105; H01L 2224/32225; H01L 2225/1058; H01L 2924/15311
  See application file for complete search history.

(56) References Cited

U.S. PATENT DOCUMENTS

| | | | |
|---|---|---|---|
| 2011/0006404 A1* | 1/2011 | Lee | H01L 23/3114 257/E23.179 |
| 2013/0049195 A1* | 2/2013 | Wu | H01L 21/561 257/738 |
| 2014/0091455 A1* | 4/2014 | Strothmann | H01L 21/568 257/734 |
| 2016/0035828 A1* | 2/2016 | Mizuhara | B23K 26/361 257/620 |
| 2017/0062300 A1* | 3/2017 | Cheng | H01L 25/105 |
| 2018/0082988 A1* | 3/2018 | Cheng | H01L 21/561 |
| 2019/0006290 A1 | 1/2019 | Jang et al. | |
| 2020/0075562 A1* | 3/2020 | Yu | H01L 25/0657 |
| 2020/0411399 A1 | 12/2020 | Wu et al. | |

* cited by examiner

DICING PROCESS IN PACKAGES COMPRISING ORGANIC INTERPOSERS

PRIORITY CLAIM AND CROSS-REFERENCE

This application claims the benefit of the following provisionally filed U.S. Patent Application No. 63/224,478, filed on Jul. 22, 2021, and entitled "Polyimide Dicing Process in Organic Interposer Package," which application is hereby incorporated herein by reference.

BACKGROUND

In the packaging of integrated circuits, a plurality of device dies may be bonded to a redistribution structure. The device dies are then molded in a molding compound to form a reconstructed wafer. To separate the resulting packages in the reconstructed wafer from each other, a precutting process may be performed through laser precutting. A singulation process is then performed to form discrete packages.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
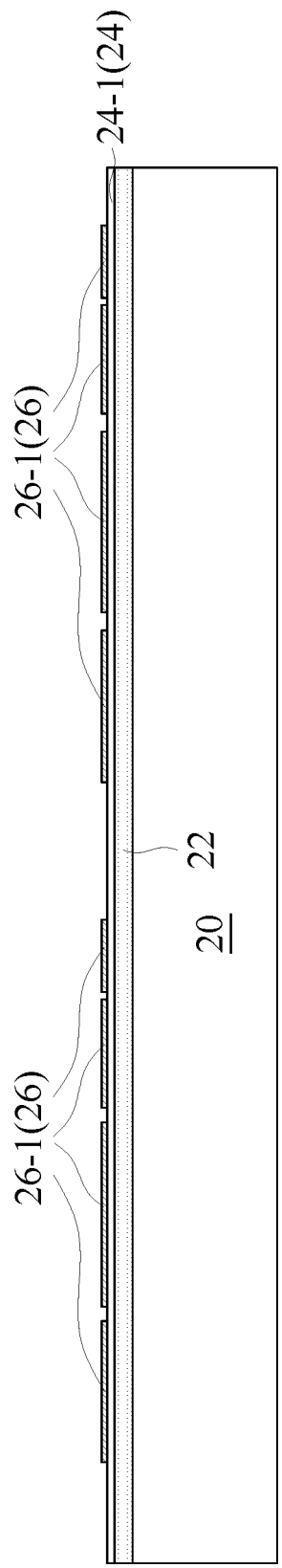
FIGS. 1-11 illustrate the cross-sectional views of intermediate stages in the formation of a package in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A method of precutting a package and the resulting packages are provided. In accordance with some embodiments of the present disclosure, a packaging process includes forming a redistribution structure that may include an organic material, bonding device dies on the redistribution structure, encapsulating the device dies to form a reconstructed wafer, and precutting the reconstructed wafer using a blade. A sawing process is then performed to separate the reconstructed wafer into a plurality of packages, each including one of the device dies. By using the blade (rather than laser) to perform the precutting process, the formation of a recast layer due to the melting of the organic material is avoided. Since the recast layer may cause the delamination in subsequent processes, by avoiding the formation of the recast layer, the delamination is avoided. Embodiments discussed herein are to provide examples to enable making or using the subject matter of this disclosure, and a person having ordinary skill in the art will readily understand modifications that can be made while remaining within contemplated scopes of different embodiments. Throughout the various views and illustrative embodiments, like reference numbers are used to designate like elements. Although method embodiments may be discussed as being performed in a particular order, other method embodiments may be performed in any logical order.

FIGS. 1 through 11 illustrate the cross-sectional views of intermediate stages in the formation of a package in accordance with some embodiments of the present disclosure. The corresponding processes are also reflected schematically in the process flow shown in FIG. 20.

FIG. 1 illustrates carrier 20 and release film 22 formed on carrier 20. Carrier 20 may be a glass carrier, a silicon wafer, an organic carrier, or the like. Carrier 20 may have a round top-view shape in accordance with some embodiments. Release film 22 may be formed of a polymer-based material and/or an epoxy-based thermal-release material (such as a Light-To-Heat-Conversion (LTHC) material), which is capable of being decomposed under radiation such as a laser beam, so that carrier 20 may be de-bonded from the overlying structures that will be formed in subsequent processes. In accordance with some embodiments of the present disclosure, release film 22 is coated onto carrier 20.

Figure 2:
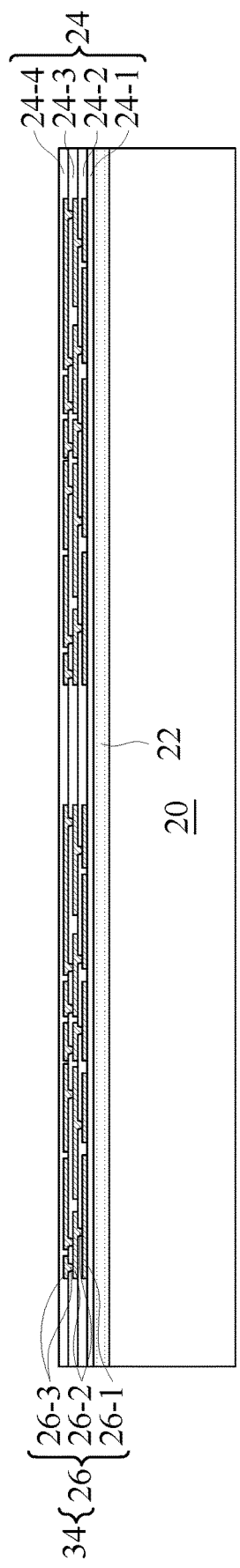
Figure 3:
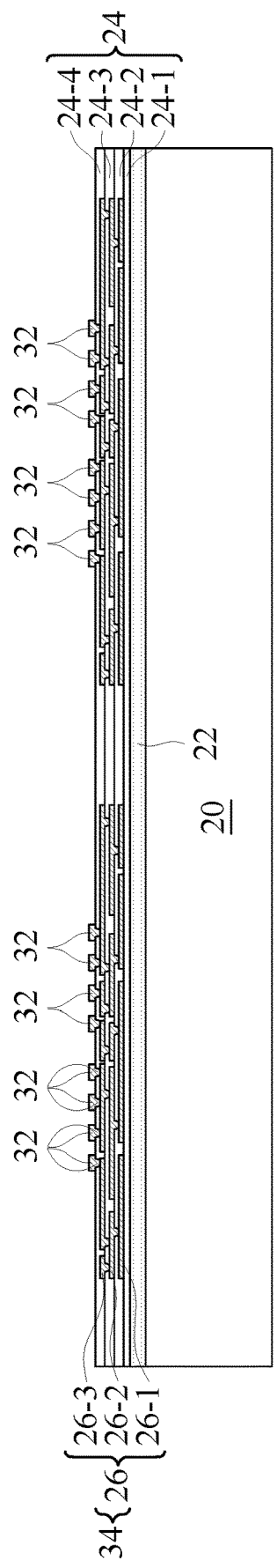
Figure 20:
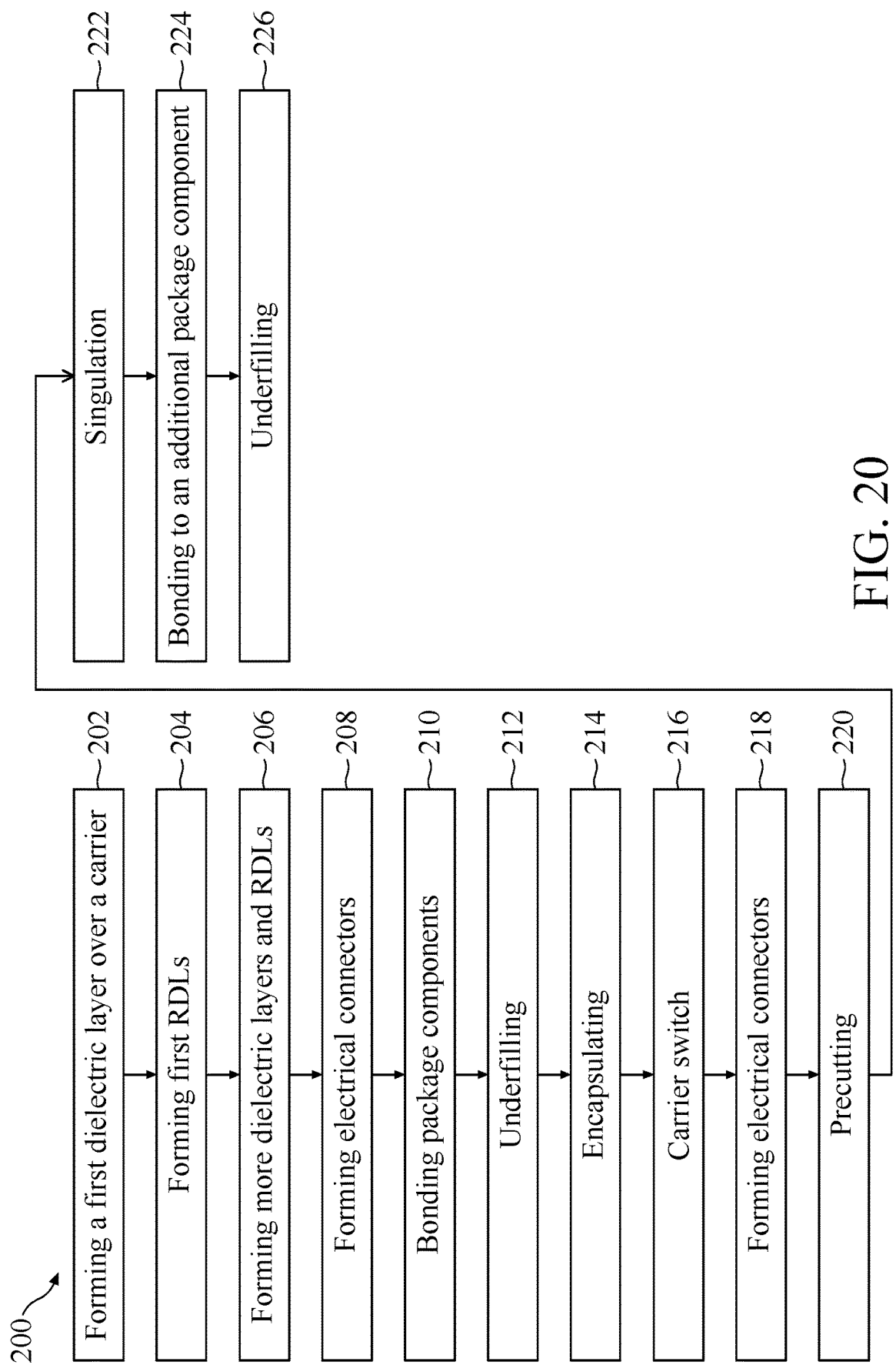
FIG. 20 illustrates a process flow for forming a package in accordance with some embodiments.

A redistribution structure, which includes a plurality of dielectric layers 24 and a plurality of RDLs 26 are formed over the release film 22, as shown in FIGS. 1 through 3. Referring to FIG. 1, a first dielectric layer 24-1, which is one of dielectric layers 24, is formed on release film 22. The respective process is illustrated as process 202 in the process flow 200 as shown in FIG. 20. In accordance with some embodiments of the present disclosure, dielectric layer 24-1 is formed of or comprises an organic material, which may be a polymer. The organic material may also be a photo-sensitive material. For example, dielectric layer 24-1 may be formed of or comprise polyimide, polybenzoxazole (PBO), benzocyclobutene (BCB), or the like.

Redistribution Lines (RDLs) 26 (denoted as 26-1) are formed on dielectric layer 24-1. The respective process is illustrated as process 204 in the process flow 200 as shown in FIG. 20. The formation of RDLs 26-1 may include forming a metal seed layer (not shown) over dielectric layer 24-1, forming a patterned mask (not shown) such as a photoresist over the metal seed layer, and then performing a metal plating process on the exposed metal seed layer. The patterned mask and the portions of the metal seed layer covered by the patterned mask are then removed, leaving RDLs 26-1 as shown in FIG. 1. In accordance with some embodiments of the present disclosure, the metal seed layer includes a titanium layer and a copper layer over the titanium layer. The metal seed layer may be formed using, for example, Physical Vapor Deposition (PVD) or a like process. The plating may be performed using, for example, a chemical electrical plating process.

FIG. 2 illustrates the formation of additional dielectric layers 24 (including 24-2, 24-3, and 24-4, for example) and additional RDLs 26 (including 26-2 and 26-3, for example). The respective process is illustrated as process 206 in the process flow 200 as shown in FIG. 20. In accordance with some embodiments, dielectric layer 24-2 is first formed on RDLs 26-1. The bottom surface of dielectric layer 24-2 is in contact with the top surfaces of RDLs 26-1 and dielectric layer 24-1. Dielectric layer 24-2 may be formed of or comprise an organic dielectric material, which may be a polymer. For example, dielectric layer 24-2 may comprise a photo-sensitive material such as PBO, polyimide, BCB, or the like. Dielectric layer 24-2 is then patterned to form via openings (occupied by the via portions of RDLs 26-2) therein. Hence, some portions of RDLs 26-1 are exposed through the openings in dielectric layer 24-2.

Next, RDLs 26-2 are formed on dielectric layer 24-2 to connect to RDLs 26-1. RDLs 26-2 include via portions extending into the openings in dielectric layer 24-2, and trace portions (metal line portions) over dielectric layer 24-2. In accordance with some embodiments, the formation of RDLs 26-2 may include depositing a blanket metal seed layer extending into the via openings, and forming and patterning a plating mask (such as a photoresist), with openings formed in the plating mask and directly over the via openings. A plating process is then performed to plate a metallic material, which fully fills the via openings, and has some portions higher than the top surface of dielectric layer 24-2. The plating mask is then removed, followed by an etching process to remove the exposed portions of the metal seed layer, which was previously covered by the plating mask. The remaining portions of the metal seed layer and the plated metallic material are RDLs 26-2. RDLs 26-2 include RDL lines (also referred to as traces, trace portions) and via portions (also referred to as vias). The trace portions are over dielectric layer 24-2, and the via portions are in dielectric layer 24-2. Each of the vias may have a tapered profile, with the upper portions wider than the corresponding lower portions.

The metal seed layer and the plated material may be formed of the same material or different materials. For example, the metal seed layer may include a titanium layer, and a copper layer over the titanium layer. The plated metallic material in RDLs 26-2 may include a metal or a metal alloy including copper, aluminum, tungsten, or the like, or alloys thereof.

After the formation of RDLs 26-2, there may be more dielectric layers and the corresponding RDLs formed, with the upper RDLs over and landing on the respective lower RDLs. For example, FIG. 2 illustrates dielectric layers 24-3 and 24-4, and RDLs 26-3 as an example. It is appreciated that there may be more dielectric layers and RDLs formed. The material of dielectric layers 24-3 and 24-4 may be selected from the same group (or different group) of candidate materials as dielectric layers 24-1 and 24-2. For example, dielectric layers 24-3 and 24-4 may be formed of an organic material, which may be a polymer such as polyimide, PBO, BCB, or the like. RDLs 26-3 may also be formed of similar materials, and using similar formation processes, as RDLs 26-1 and 26-2.

Referring to FIG. 3, after the formation of a top dielectric layer such as dielectric layer 24-2, electrical connectors 32 are formed. The respective process is illustrated as process 208 in the process flow 200 as shown in FIG. 20. Electrical connectors 32 may be formed of or comprise metal pads, metal pillars, Under-Bump-Metallurgies (UBMs), microbumps, solder regions, and/or the like. The formation of electrical connectors 32 may also be similar to the formation of RDLs 26-2, which includes patterning the top dielectric layer to expose the underlying RDLs, forming a metal seed layer, forming a patterned plating mask, performing one or a plurality of plating processes, removing the plating mask, and etching the metal seed layer. When electrical connectors 32 include solder regions, the solder regions may be plated following the plating process for forming metal pillars, plated on the metal pillars, and then reflowed.

Throughout the description, the dielectric layers including 24-1 through 24-4 are collectively referred to as dielectric layers 24, and the RDLs including RDLs 26-1, 26-2, and RDLs 26-3 are collectively referred to as RDLs 26. Dielectric layers 24, RDLs 26, and electrical connectors 32 collectively form redistribution structure 34, which is alternatively referred to as interconnect component 34 or organic interposer 34.

Figure 4:
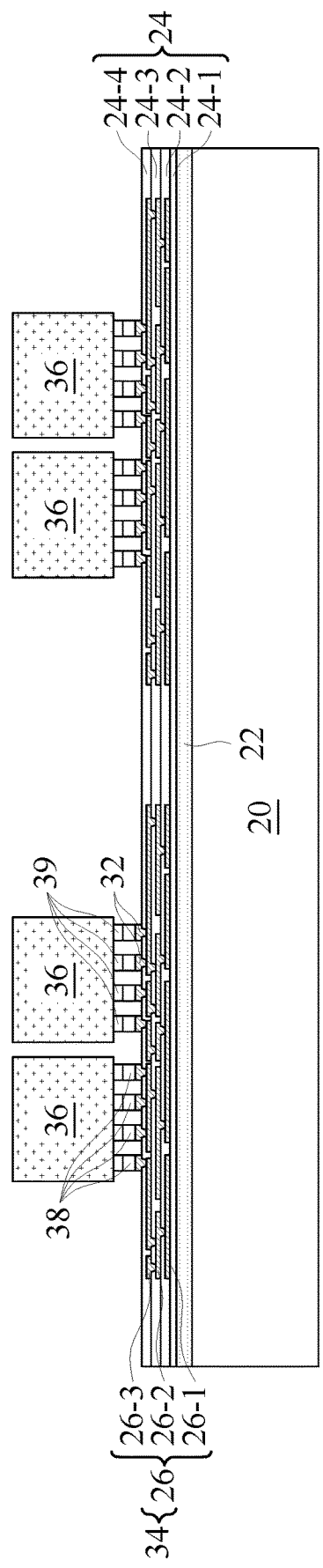

FIG. 4 illustrates the bonding of package components 36 to interconnect component 34. The respective process is illustrated as process 210 in the process flow 200 as shown in FIG. 20. Electrical connectors 39, which are the surface features of interconnect component 34, may be bonded to electrical connectors 32 through solder regions 38 in accordance with some embodiments. Electrical connectors 39 may be UBMs, metal pillars, bond pads, or the like. In accordance with alternative embodiments, electrical connectors 39 are metal pillars, and are bonded to electrical connectors 32 through direct metal-to-metal bonding, with no solder regions therebetween.

In accordance with some embodiments, package components 36 include a plurality of groups of package components, with the groups being identical to each other. Each of the groups may be a single-component group or a multi-component group. For example, FIG. 4 illustrates an example in which each group includes two package components 36. In accordance with some embodiments, package components 36 include a logic die, which may be a Central Processing Unit (CPU) die, a Graphic Processing Unit (GPU) die, a mobile application die, a Micro Control Unit (MCU) die, an input-output (IO) die, a BaseBand (BB) die, an Application processor (AP) die, or the like. Package components 36 may also include memory dies such as Dynamic Random Access Memory (DRAM) dies, Static Random Access Memory (SRAM) dies, or the like. The memory dies may be discrete memory dies, or may be in the form of a die stack that includes a plurality of stacked memory dies. Package components 36 may also include System-on-Chip (SOC) dies.

Figure 5:
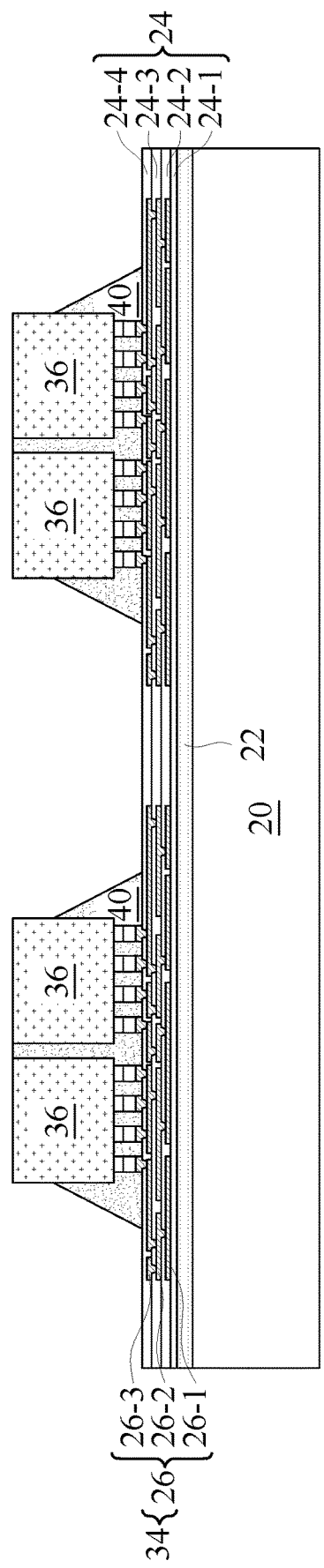

Referring to FIG. 5, underfill 40 is dispensed into the gaps between package components 36 and interconnect component 34. The respective process is illustrated as process 212 in the process flow 200 as shown in FIG. 20. Underfill 40 may also be dispensed between neighboring package components 36 that are in the same group of package components. In accordance with some embodiments, underfill 40 includes a base material) and filler particles mixed in the base material. The base material may be a resin, an epoxy, and/or a polymer. Some example base materials include epoxy-amine, epoxy anhydride, epoxy phenol, or the like, or the combinations thereof. The filler particles may be formed of a dielectric material, and may include silica, alumina, boron nitride, or the like, which may be in the form of spherical particles. Underfill 40 is dispensed in a flowable form, and is then cured. In accordance with alternative embodiments, underfill 40 is formed of a non-conductive film, which is dispensed on interconnect component 34 first, and package components 36 are pressed against interconnect component 34, so that the electrical connectors in package components 36 penetrate through the non-conductive film to contact electrical connectors 32.

Figure 6:
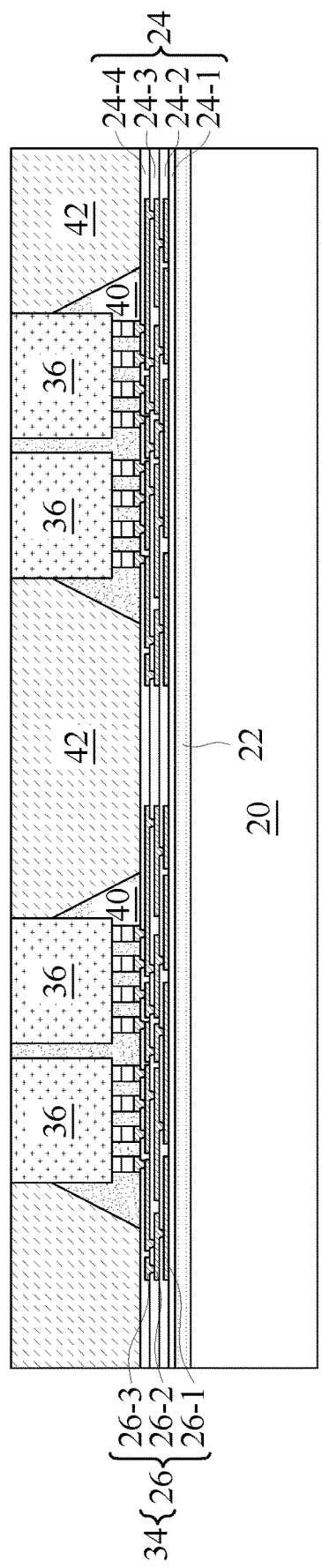

Next, package components 36 are encapsulated in encapsulant 42, as shown in FIG. 6. The respective process is illustrated as process 214 in the process flow 200 as shown in FIG. 20. Encapsulant 42 may include a molding compound, a molding underfill, an epoxy, and/or a resin. The molding compound may include a base material (42A, FIG. 18), which may be a polymer, a resin, an epoxy, or the like, and filler particles 42B in base material 42A. The filler particles 42B may be dielectric particles of $SiO_2$, $Al_2O_3$, silica, or the like, and may have spherical shapes. Also, the spherical filler particles may have the same or different diameters. There may be a distinguishable interface between underfill 40 and encapsulant 42.

In a subsequent process, a planarization process such as a Chemical Mechanical Polish (CMP) process or a mechanical grinding process is performed to polish encapsulant 42. Package components 36 may be exposed as a result of the planarization process. For example, when package components 36 comprise semiconductor substrates, the semiconductor substrates may be exposed. Throughout the description, the structure over release film 22, which structure includes redistribution component 34, package components 36, underfill 40, and encapsulant 42, is referred to as reconstructed wafer 44.

Figure 7:
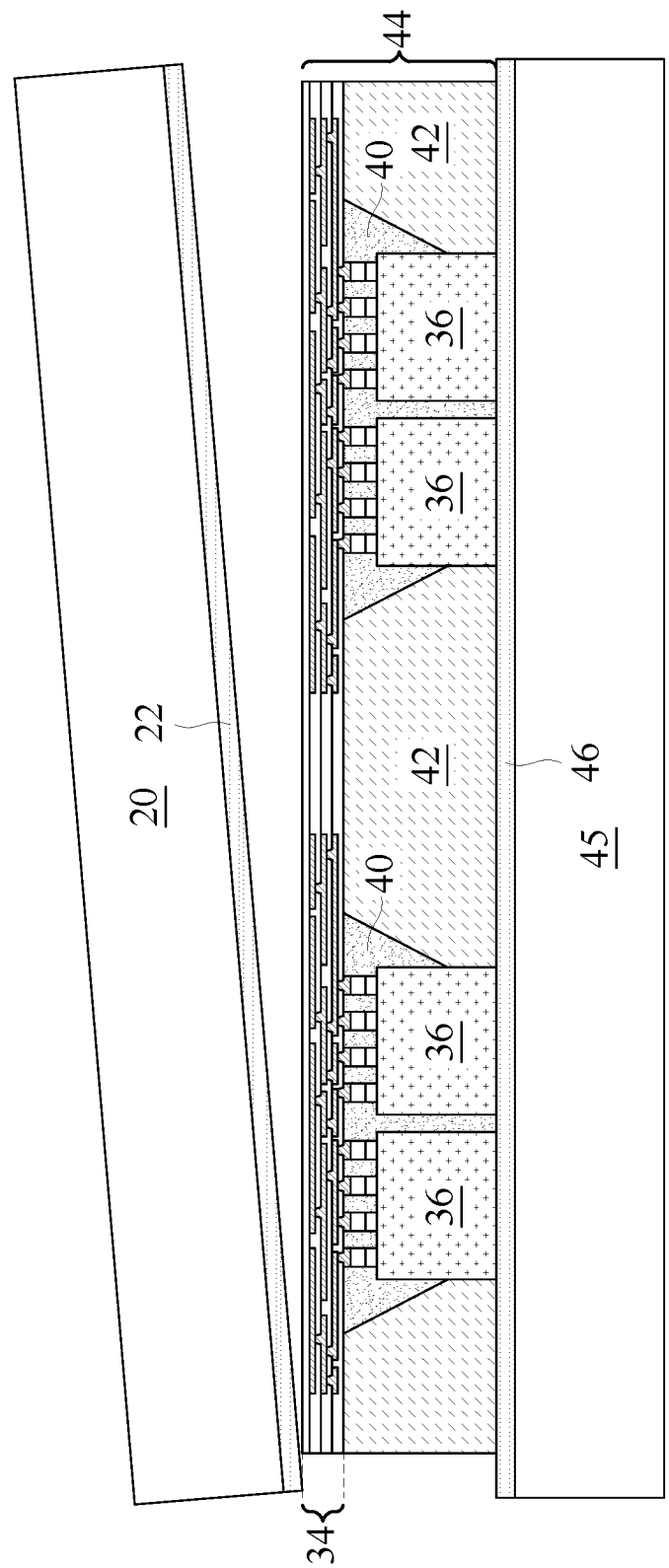

FIG. 7 illustrates a carrier switch process. The respective process is illustrated as process 216 in the process flow 200 as shown in FIG. 20. First, a second carrier 45 is adhered to an opposite side of the reconstructed wafer 44 than carrier 20. Release film 46, which may also comprise a thermal release film such as an LTHC, is used to adhere carrier 45 to the reconstructed wafer 44. The reconstructed wafer 44 is then de-bonded from carrier 20, for example, by projecting UV light or a laser beam, which penetrates through carrier 20, and is projected on release film 22. Release film 22 decomposes under the heat of the UV light or the laser beam. The reconstructed wafer 44 may then be removed from carrier 20.

Figure 8:
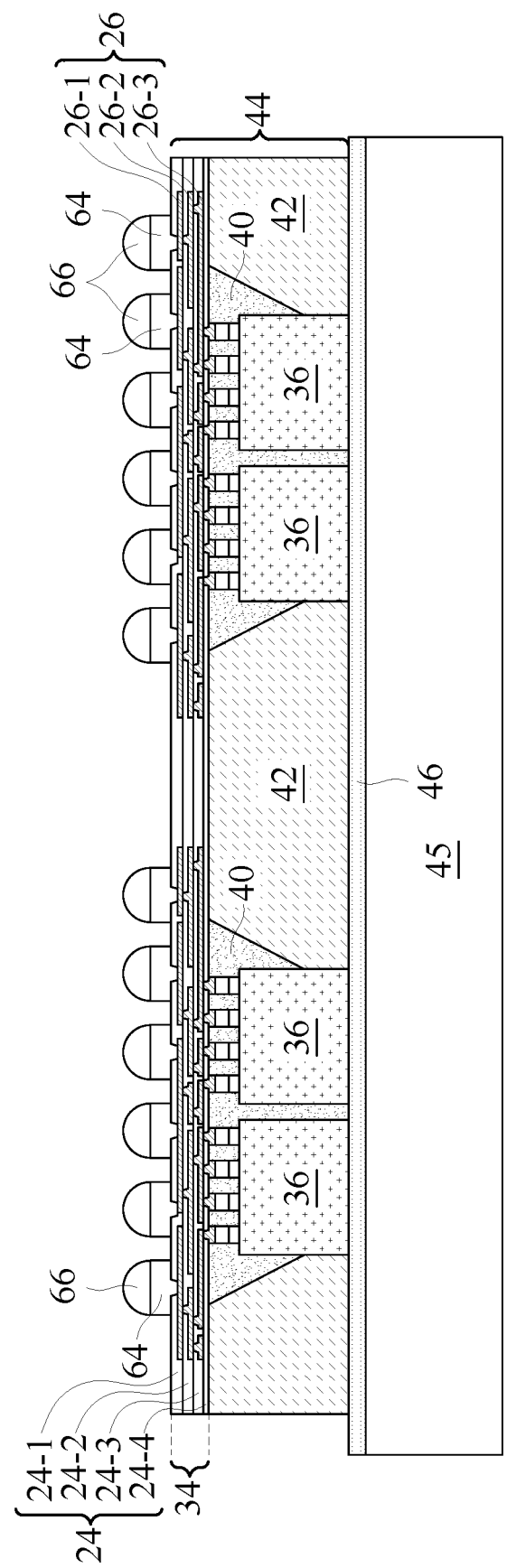

FIG. 8 illustrates the formation of electrical connectors 64 and solder regions 66. The respective process is illustrated as process 218 in the process flow 200 as shown in FIG. 20. In accordance with some embodiments, the formation process includes patterning the top dielectric layer (such as dielectric layer 24-1) in interconnect component 34 to reveal parts of the underlying portions of RDLs (such as RDLs 26-1), depositing a metal seed layer, forming a patterned plating mask (such as photoresist), and plating the electric connectors 64. When solder regions 66 are to be formed, solder regions 66 may also be plated. The patterned plating mask is then removed, followed by an etching process to remove the exposed portions of the metal seed layer. A reflow process may be performed to reflow solder regions 66.

Figure 9:
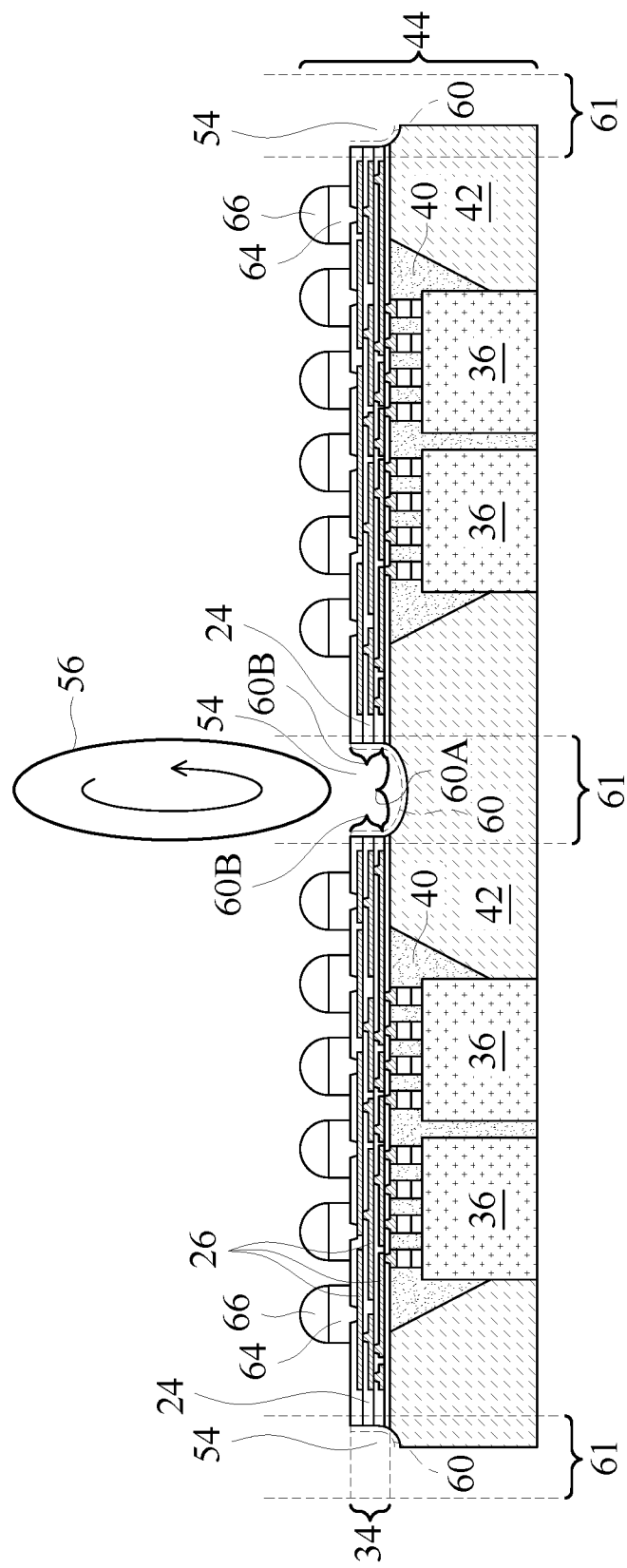

FIG. 9 illustrates the precutting of interconnect component 34 and some top portions of encapsulant 42. The respective process is illustrated as process 220 in the process flow 200 as shown in FIG. 20. Trenches 54 are thus formed by the precutting process. The trenches 54 penetrate through dielectric layers 24 in interconnect component 34, and extend into a top portion of encapsulant 42. Trenches 54 are formed within the respective scribe lines 61 of the reconstructed wafer 44. When viewed in a top view of reconstructed wafer 44, there are a plurality of trenches 54 formed, with a first plurality of trenches 54 parallel to a first direction, and a second plurality of trenches 54 parallel to a second direction perpendicular to the first direction.

In accordance with some embodiments, the precutting is performed using blade 56, which has the cutting surface designed according to the desirable shape of the trenches 54. For example, in the illustrated example as shown in FIG. 9, each of trenches 54 has a shallow U-shape, which includes opposing sidewalls, and a curved bottom surface connected to the opposing straight sidewalls. The sidewalls may be straight, and may be vertical or slanted. The sidewalls may also be continuously and smoothly curved. When the sidewalls are vertical and straight, the vertical and straight sidewalls are the upper parts of the sidewalls of dielectric layers 24, and the lower parts of the sidewalls of dielectric layers 24 are curved. In accordance with some embodiments when the top portions of the sidewalls of dielectric layers 24 facing trenches 54 are vertical and straight. The curved bottom surface may be rounded, and may fit to a part of a circle. In accordance with some embodiments, the curved bottom surface starts curving in dielectric layers 24, and the curves extend into encapsulant 42. In accordance with alternative embodiments when the sidewalls are straight, the straight sidewalls extend into encapsulant 42. The smooth and continuous sidewalls and bottom surface may prevent stress from concentrating to the interface between interconnect component 34 and encapsulant 42. This in turn reduces the possibility of peeling, as will be discussed in subsequent paragraphs.

As a result of using blade 56 to perform the precutting, instead of using laser, this is no recast layer formed. For example, FIG. 9 illustrates recast layer 60 (shown with dashed lines) that would be formed if the precutting is performed using laser. If laser is used, since dielectric layers 24 of interconnect component 34 are formed of inorganic materials, due to the heat of the laser, some edge portions of dielectric layer 24 may be molten. The molten portions flow down to cover some portions of encapsulant 42. Due to the significant difference between the organic material of dielectric layer 24 and encapsulant 42, the recast layer has high possibility of peeling from encapsulant 42. Accordingly, by using a blade rather than laser, the recast layer is not formed, and the delamination is avoided.

Figure 18:
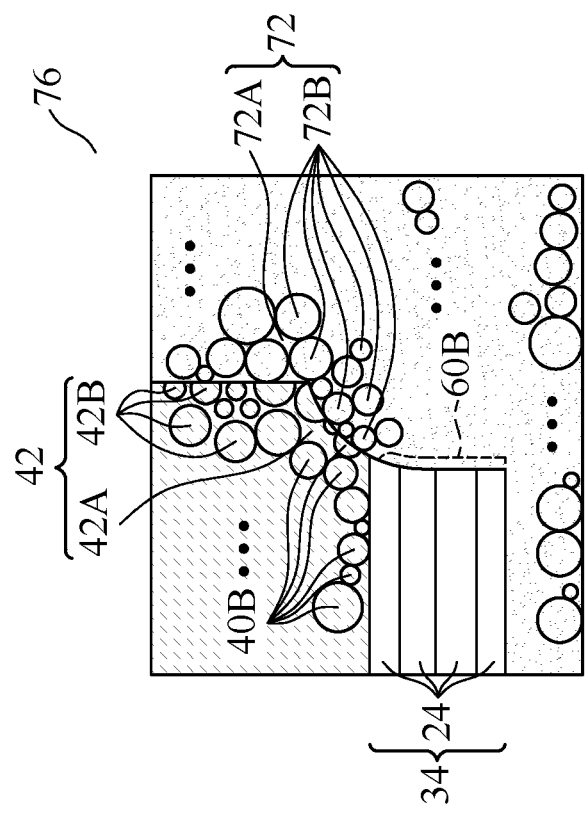
FIG. 18 illustrates an amplified view of a part of a package in accordance with some embodiments.

Due to the physical cutting using blade, some of filler particles in encapsulant 42 may also be removed partially. For example, FIG. 18 illustrates a portion of the encapsulant 42. At the surface (such as the illustrated curved surface) of encapsulant 42 generate by the precutting process, some parts of filler particles 42B, which may be spherical particles, are removed, and the remaining filler particles 42B may be partial particles. The exposed surfaces of the filler particles 42B that have been cut become planar, substantially planar, or slightly curved to fit the shape of the blade 56.

Figure 19:
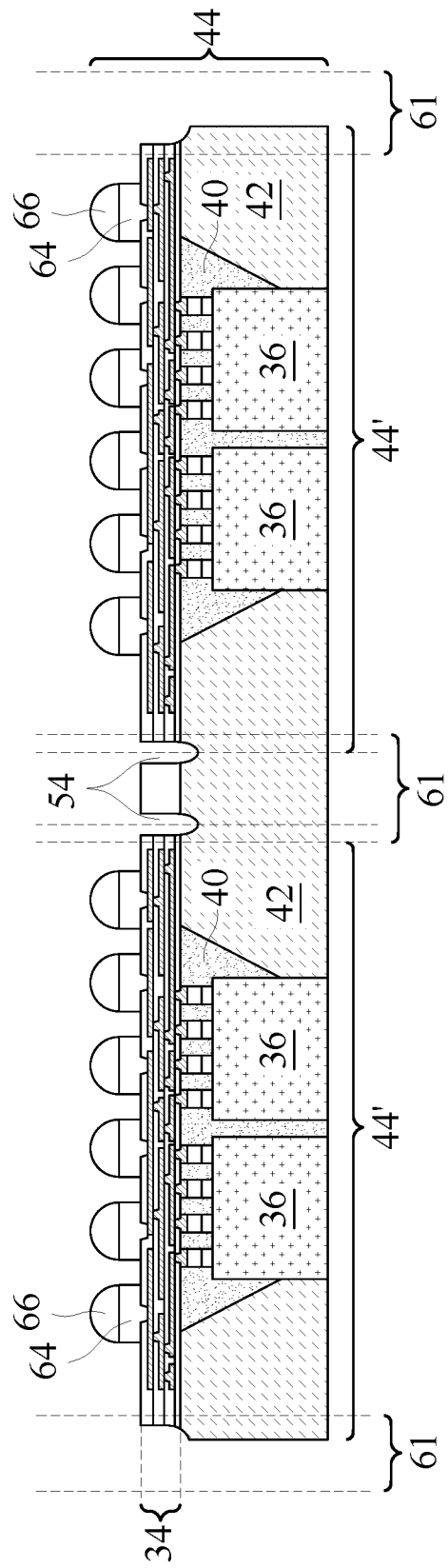
FIG. 19 illustrates a precutting process in which two precuts are performed in a same scribe line in accordance with some embodiments.

Referring back to FIG. 9, in accordance with some embodiments, between two neighboring package components that are to be separated, a single precutting process is performed. Accordingly, there is a single trench 54 in each of scribe lines 61. In accordance with alternative embodiments, two trenches 54 are formed in each of scribe lines 61, with each of the trenches 54 formed by one precutting process. For example, FIG. 19 illustrates two trenches 54 formed neighboring each other and in the same scribe line 61. The two trenches 54 are separated from each other, with a portion of dielectric layers 24 left in between.

In accordance with some embodiments, a two-step precutting process may be performed. Before the precutting using blade 56 as shown in FIG. 9, a laser precutting may be performed to cut through dielectric layers 24, during which recast layer 60 is generated. A precutting process using blade 56 (referred to as blade precutting hereinafter) may then be performed to remove the recast layer, and to deepen, widen, and/or reshape trenches 54, so that trenches 54 may have desirable shapes. Since the properties of the recast layer 60 are the same or similar to that of dielectric layers 24, the recast layer 60 has good adhesion to dielectric layers 24, and is unlikely to peel from dielectric layers 24. Accordingly, in accordance with some embodiments, the blade precutting may remove the portion 60A of recast layer 60, which is in contact with encapsulant 42, but leave some portions 60B of recast layer 60 on the sidewalls of dielectric layers 24 intact. The entirety of the surfaces of encapsulant 42 covered by recast layer 60 is thus re-exposed. Some portions of the sidewalls of dielectric layers 24 may also be re-exposed after the blade precutting, while some other portions of the sidewalls of dielectric layers 24 may remain to be covered by the remaining recast layer 60, as illustrated and discussed referring to FIG. 18. In accordance with alternative embodiments, the blade precutting may remove the entirety of the recast layer 60, and no recast layer 60 is left after the blade precutting. The two-step precutting process may reduce the likelihood of delamination between interconnect component 34 and encapsulant 42, which delamination is caused by the recast layer. On the other hand, the laser precutting has reduced stress on dielectric layers 24 and encapsulant 42, and the likelihood of delamination between dielectric layers 24 and encapsulant 42 is reduced.

Figure 10:
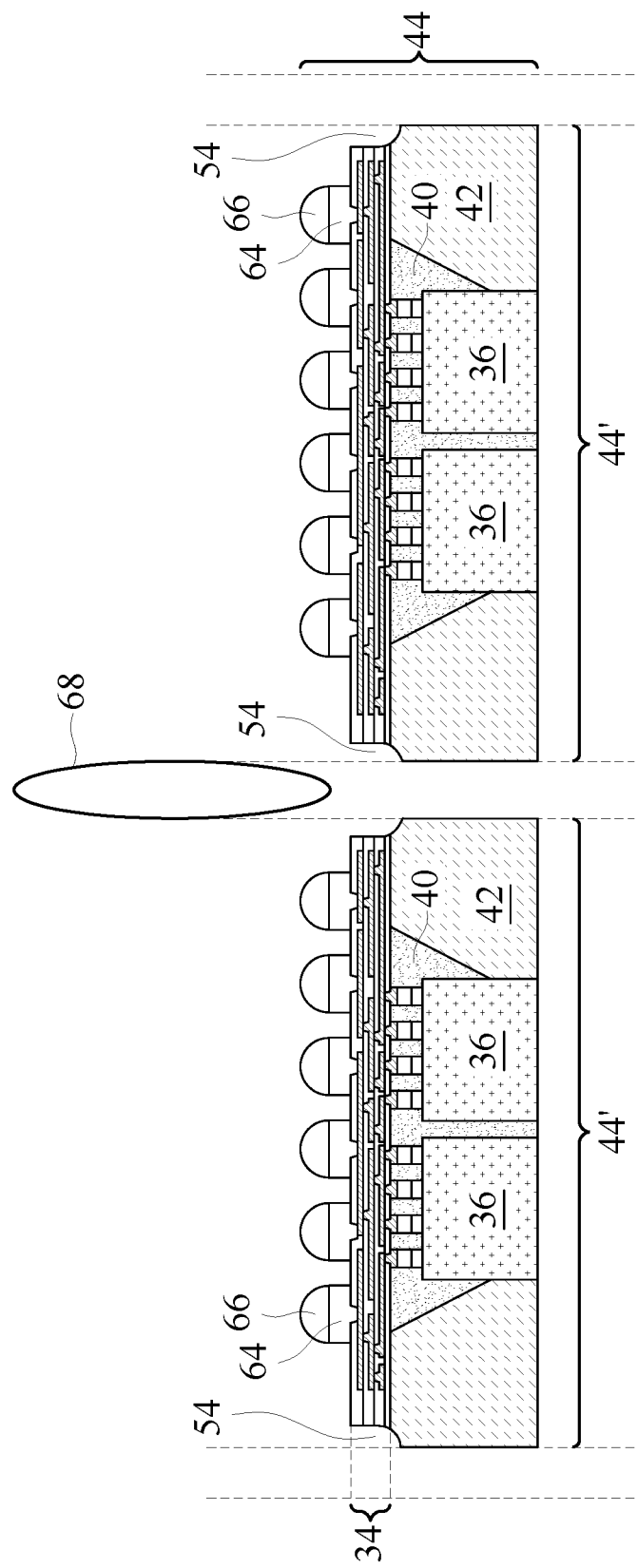

FIG. 10 illustrates the singulation of reconstructed wafer 44, so that a plurality of discrete packages 44' are formed. The respective process is illustrated as process 222 in the process flow 200 as shown in FIG. 20. The singulation process may be performed using blade 68. The kerf passes through encapsulant 42, and is spaced apart from dielectric layers 24. Accordingly, the blade 68 does not exert force on dielectric layers 24, and the singulation process does not cause the delamination of dielectric layers 24 from encapsulant 42. In accordance with alternative embodiments, a laser beam may be used to perform the singulation process. In the embodiments as shown in FIG. 19, the singulation process also removes the portions of dielectric layers 24 between two neighboring trenches 54.

In accordance with some embodiments in which both of the precutting process and the singulation processes are performed using blades, a single tool may be used to perform both of the precutting process and the singulation processes.

Figure 11:
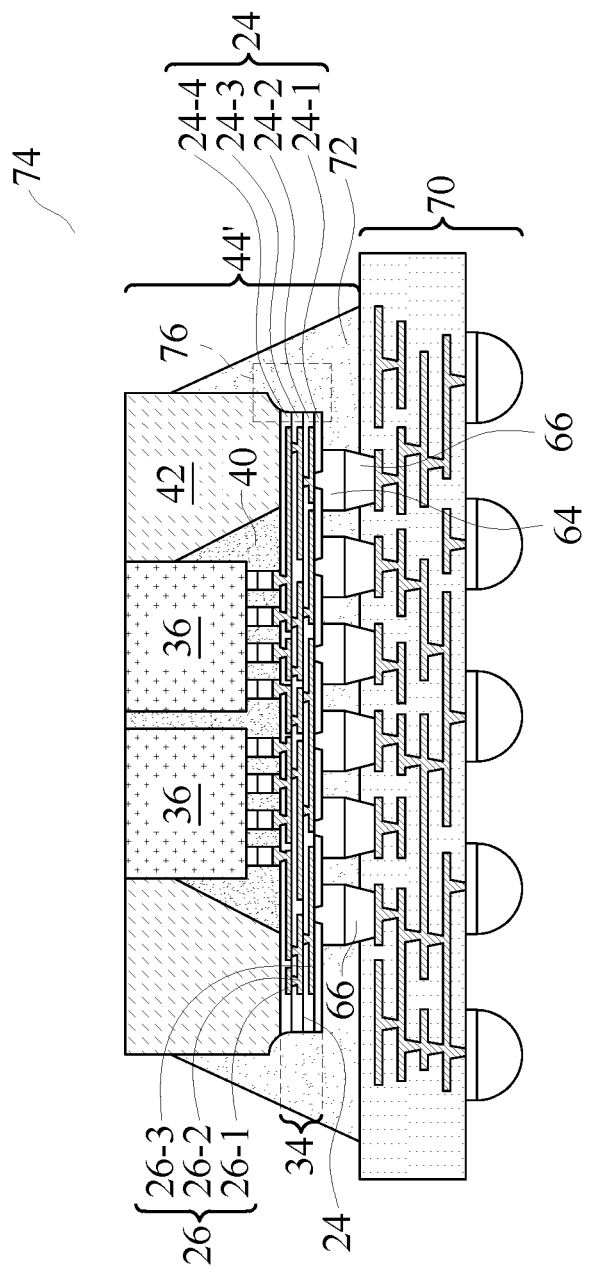

FIG. 11 illustrates the bonding of package 44' on another package component 70 to form package 74. The respective process is illustrated as process 224 in the process flow 200 as shown in FIG. 20. Package component 70 may comprise a package substrate, a printed circuit board, a package, an interposer, or the like. In accordance with some embodiments, the bonding includes solder bonding, in which solder regions 66 are used. In accordance with alternative embodiments, direct metal-to-metal bonding may be adopted.

Underfill 72 is then applied into the gap between package 44' and package component 70. The respective process is illustrated as process 226 in the process flow 200 as shown in FIG. 20. In accordance with some embodiments, underfill 72 includes a base material 72A (FIG. 18) and filler particles 72B mixed in the base material 72A. The base material 72A may include a resin, an epoxy, and/or a polymer. Some example base materials include epoxy-amine, epoxy anhydride, epoxy phenol, or the like, or the combinations thereof. The filler particles 72B are formed of a dielectric material, and may include silica, alumina, boron nitride, or the like, which may be in the form of spherical particles. Underfill 72 is dispensed in a flowable form, and is then cured.

FIG. 18 illustrates a magnified view of portion 76 of the package 74 as shown in FIG. 11. In accordance with some embodiments, encapsulant 42 includes base material 42A and filler particles 42B, which are in physical contact with underfill 72. Underfill 72 also may also include base material 72A and filler particles 72B. Some of filler particles 42B at the cut surface (cut in the precutting process and the singulation process) may be partial particles, and the substantially planar (or slightly curved) surfaces of the partial particles 42B physically contact the base material 72A and the rounded surfaces of filler particles 72B in underfill 72. In accordance with some embodiments, underfill 72 contacts the entire sidewalls of dielectric layers 24. In accordance with alternative embodiments in which a laser precutting is performed before the cutting using the blade (referred to as blade cutting hereinafter), and the blade cutting removes parts of the recast layer 60, the recast layer 60 may be left on parts of the surface of dielectric layers 24, but does not extend on encapsulant 42. The recast layer 60 may be distinguishable from dielectric layers 24 since it has been molten and solidified.

FIGS. 12-14 and FIGS. 15-17 illustrate the cross-sectional views of intermediate stages in the formation of packages in accordance with some embodiments of the present disclosure. Unless specified otherwise, the materials and the formation processes of the components in these embodiments are essentially the same as the like components, which are denoted by like reference numerals in the preceding embodiments shown in FIGS. 1 through 11. The details regarding the formation process and the materials of the components shown in FIGS. 12-14 and FIGS. 15-17 may thus be found in the discussion of the preceding embodiments.

Figure 12:
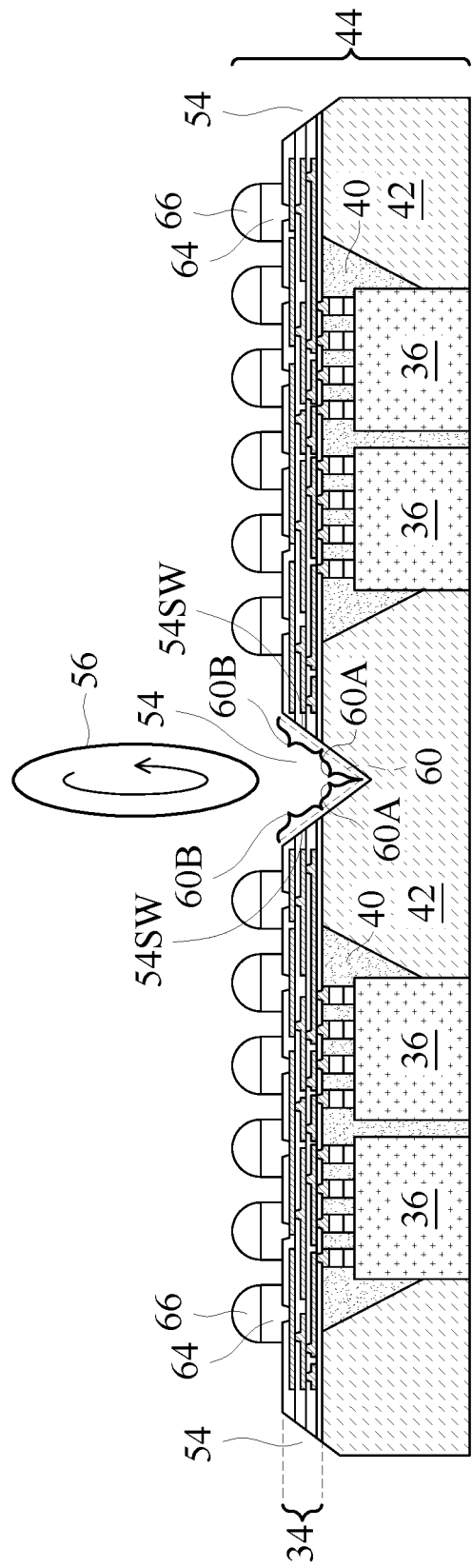
FIGS. 12-14 illustrate the cross-sectional views of intermediate stages in the formation of a package in accordance with some embodiments.
Figure 13:
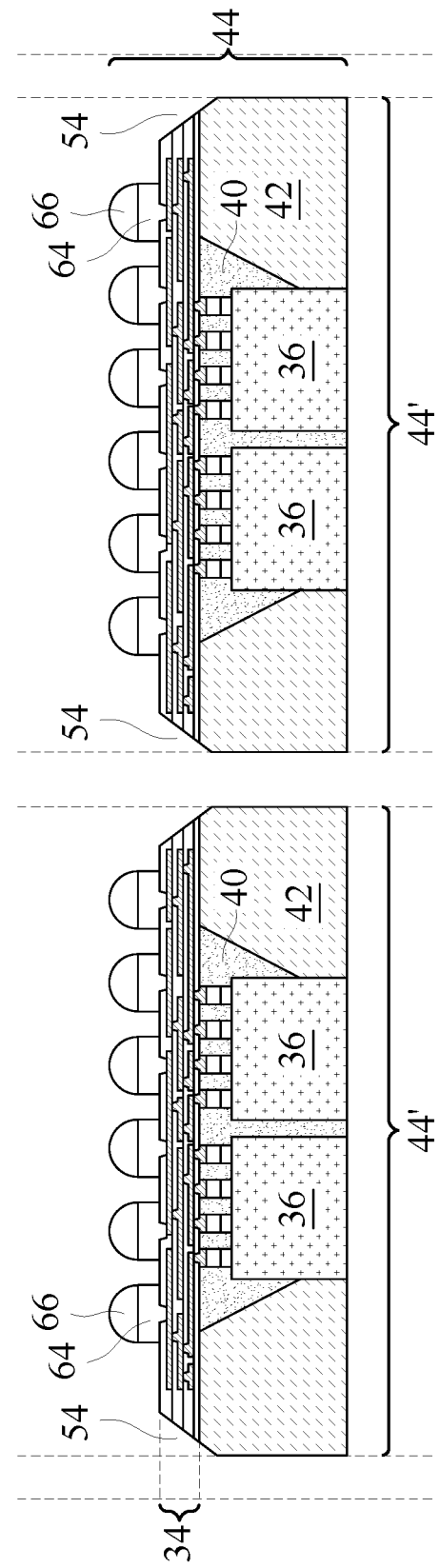
Figure 14:
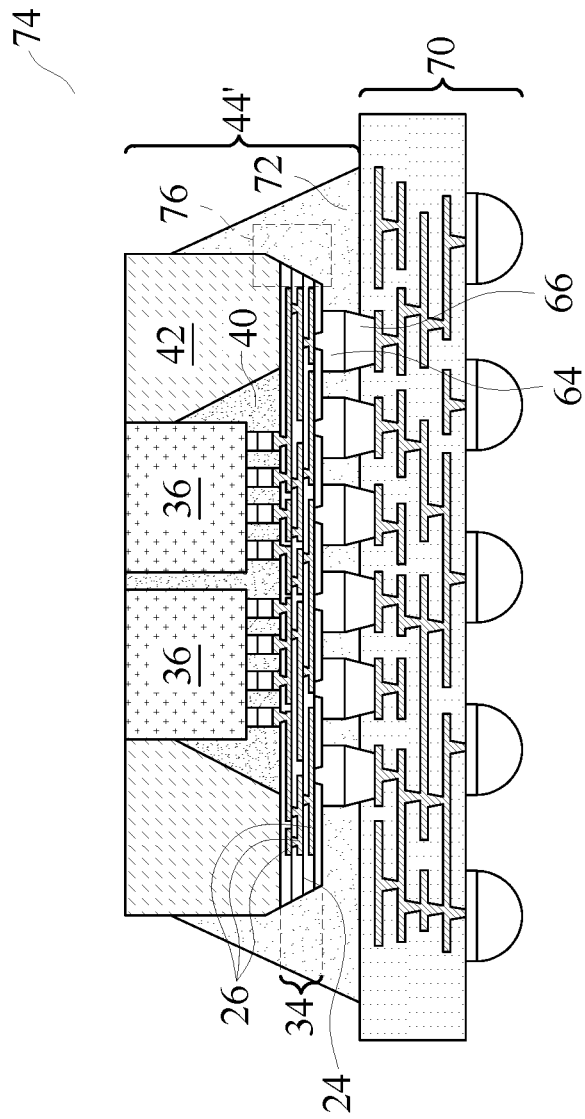

The initial steps of the embodiments of FIGS. 12 through 14 are essentially the same as shown in FIGS. 1 through 8. Next, referring to FIG. 12, a precutting process is performed to form trenches 54. The trenches 54 in accordance with these embodiments have V-shapes in the cross-section. This may be achieved by using blade 56 that has the V-shape cutting edges. The precutting may be essentially the same as shown in FIG. 9, and the details are not repeated herein. The sidewalls 54SW of trenches 54 may be straight edges or slightly curved. In accordance with some embodiments, the V-shaped trenches 54 may also be adopted in the embodiments shown in FIG. 19, so that two V-shaped trenches 54 are formed in the same scribe line 61. In accordance with alternative embodiments, a laser-precutting process may be performed, in which a recast layer 60 is formed, and a blade cutting process is then preformed to enlarge and/or widens trenches 54, and to remove the entire or some parts of the recast layer 60. Accordingly, in accordance with some embodiments, some portions 60B of the recast layer 60 may be left on the sidewalls of dielectric layers 24, but are spaced apart from encapsulant 42, as shown in FIG. 12. The portions 60A of the recast layer 60 are removed. In accordance with other embodiments, all of recast layer 60 is removed.

FIG. 13 illustrates a singulation process, in which the reconstructed wafer 44 is singulated into a plurality of discrete packages 44'. The kerfs are spaced apart from dielectric layers 24, so that no force is applied on dielectric layers 24 by blade 56. FIG. 14 illustrates the bonding of package 44' to package component 70 to form package 74. FIG. 18, which has been discussed in preceding paragraphs, may also reflect some details of the portion 76 of package 74. The magnified view of portions 76 is similar to what is shown in FIG. 18, except that the edges of dielectric layers 24 and encapsulant 42 are straight and slanted. The partial spherical filler partials 42B in FIG. 18 will have planar surfaces, which are aligned to form parts of the straight (and slanted) edges of encapsulant 42, and the straight edges are in contact with underfill 72. Similarly, underfill 72 has base material 72A and spherical particles 72B, which are in physical contact with base material 42A and partial particles 42B of encapsulant 42.

Figure 15:
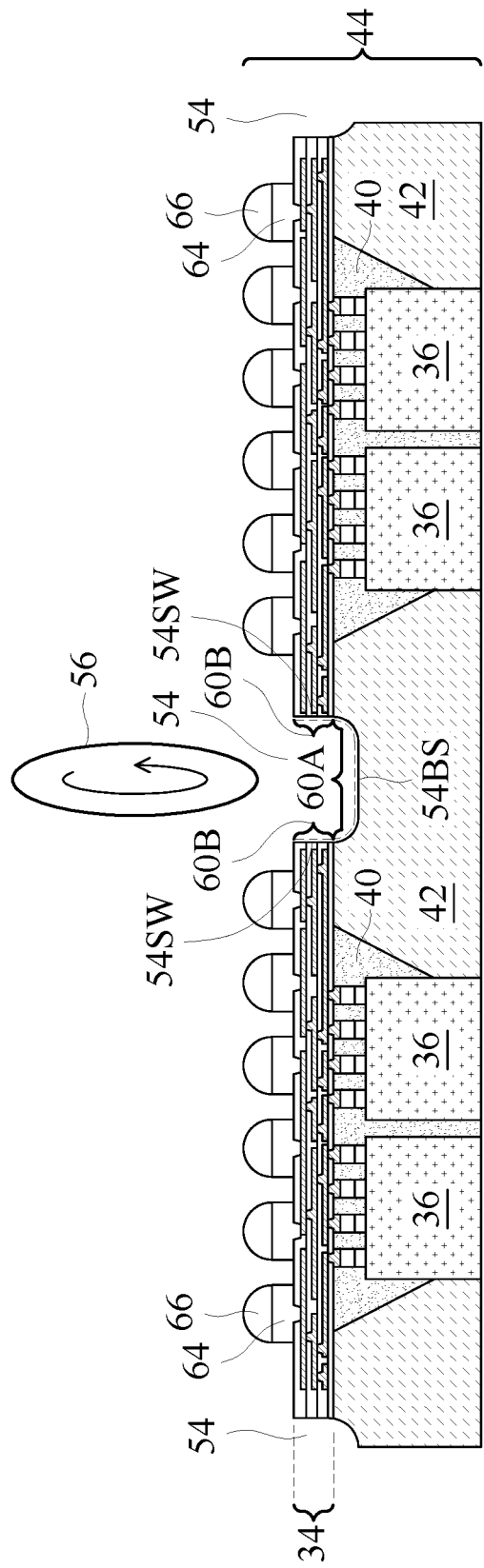
FIGS. 15-17 illustrate the cross-sectional views of intermediate stages in the formation of a package in accordance with some embodiments.
Figure 16:
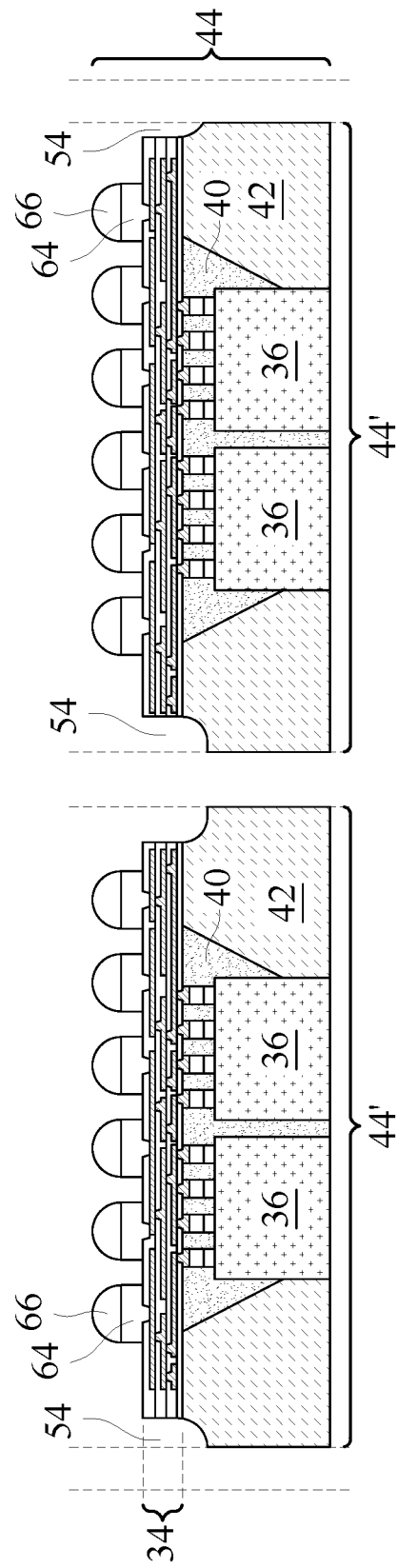
Figure 17:
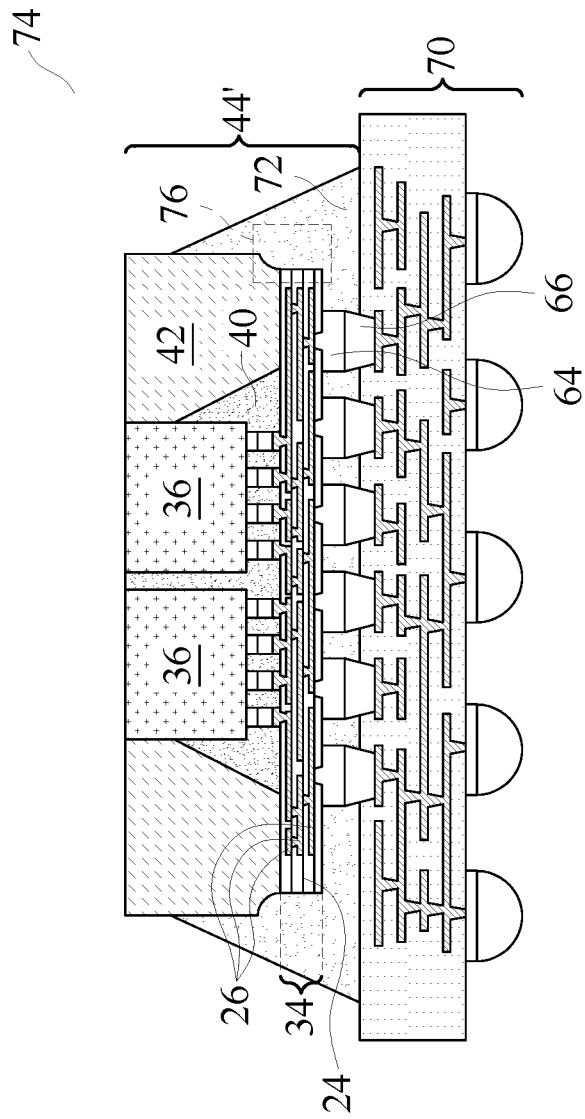

FIGS. 15 through 17 illustrate some intermediate stages in the formation of a package in accordance with yet alternative embodiments. The initial steps of the embodiments of FIGS. 15 through 17 are essentially the same as shown in FIGS. 1 through 8. Next, referring to FIG. 15, a precutting process is performed to form trenches 54. The trenches 54 in accordance with these embodiments have a deep U-shape in the cross-section. Trenches 54 may have vertical and straight sidewalls 54SW, and a flat bottom 54BS, which is connected to the vertical sidewalls 54SW through curved corners. The shape of the trenches 54 may be achieved by using blade 56 that has a U-shaped cutting edge. The precutting may be essentially the same as shown in FIG. 9, and the details are not repeated herein. In accordance with some embodiments, the U-shaped trenches 54 may be adopted in the embodiments shown in FIG. 19, so that two deep U-shaped trenches 54 are formed in the same scribe line 61.

In accordance with alternative embodiments, a two-step precutting process is performed, in which a laser-precutting process may be performed first, which forms recast layer 60 as illustrated using dashed lines. A blade precutting process is then preformed to enlarge, widen, and/or reshape trenches 54, and to remove the entire or some parts of the recast layer 60. For example, in accordance with some embodiments, the portions 60A of recast layer 60 are removed, while some portions 60B of the recast layer 60 may be left on the sidewalls of dielectric layers 24. In accordance with other embodiments, an entirety of the recast layer 60 is removed.

FIG. 16 illustrates the singulation process, in which the reconstructed wafer 44 is singulated into a plurality of discrete packages 44'. The kerfs are spaced apart from dielectric layers 24, so that no force is applied on dielectric layers 24, which are prone to peeling. FIG. 17 illustrates the bonding of package 44' to package component 70 to form package 74. FIG. 18, which has been discussed, may also reflect some details of the portion 76 of package 74 (FIG. 17). The details are similar to what are shown in FIG. 18, except that the edges of dielectric layers 24 and encapsulant 42 are curved, and are deeper. Due to the precutting and the singulation process, partial spherical filler partials 42B will have planar surfaces. Underfill 72 includes base material 72A and spherical particles 72B, which are in physical contact with base material 42A and partial particles 42B of encapsulant 42.

Referring to FIG. 18 again, if two-step cutting process is performed, with a laser precutting followed by a blade precutting process, a portion of the recast layer 60 may be left in the final package to separate underfill 72 from dielectric layers 24. No recast layer is left between underfill 72 and encapsulant 42. In accordance with other embodiments of the present disclosure, the entire sidewall of dielectric layers 24 are in contact with underfill 72, and no recast layer is left in the final package.

In above-illustrated embodiments, some processes and features are discussed in accordance with some embodiments of the present disclosure to form a three-dimensional (3D) package. Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

The embodiments of the present disclosure have some advantageous features. By using a blade rather than laser to perform precutting processes, there is no recast layer of organic materials formed. The recast layer has inferior adhesion to encapsulant such as molding compound. Accordingly, if the recast layer is formed on the molding compound, it causes the delamination of underfill from molding compound. By using the blade to perform the recast layer, the underfill may be in direct contact with the molding compound, and delamination is unlikely to occur.

In accordance with some embodiments of the present disclosure, a method comprises forming an interconnect component comprising a plurality of dielectric layers, wherein the plurality of dielectric layers comprise an organic dielectric material; and a plurality of redistribution lines extending into the plurality of dielectric layers; bonding a first package component and a second package component to the interconnect component; encapsulating the first package component and the second package component in an encapsulant; precutting the interconnect component using a blade to form a trench, wherein the trench penetrates through the interconnect component, and partially extends into the encapsulant; and performing a singulation process to separate the first package component and the second package component into a first package and a second package, respectively. In an embodiment, the trench formed by the precutting has a U-shape in a cross-section. In an embodiment, the trench formed by the precutting has a V-shape in a cross-section. In an embodiment, in the singulation process, a corresponding kerf is spaced apart from closest edges of the plurality of dielectric layers. In an embodiment, the singulation process is performed using an additional blade. In an embodiment, the singulation process is performed using laser. In an embodiment, the organic dielectric material comprises polyimide. In an embodiment, the method further comprises, before the precutting using the blade, performing an additional precutting process using laser. In an embodiment, the method further comprises bonding the first package with a package substrate; and dispensing an underfill between the first package and the package substrate, wherein the underfill physically contacts a surface of the encapsulant, wherein the surface is generated by the precutting.

In accordance with some embodiments of the present disclosure, a method comprises forming a plurality of organic layers over a carrier; forming a plurality of redistribution lines in the plurality of organic layers; attaching a top die over the plurality of redistribution lines; dispensing an underfill into a gap between the plurality of redistribution lines and the top die; applying a molding compound over the underfill and the plurality of organic layers; detaching the carrier from the plurality of organic layers; and precutting the plurality of organic layers and the molding compound with a blade. In an embodiment, a U-shaped trench is formed to extend into the plurality of organic layers and the molding compound. In an embodiment, a V-shaped trench is formed to extend into the plurality of organic layers and the molding compound. In an embodiment, the plurality of organic layers comprise polyimide. In an embodiment, the method further comprises, after the precutting, singulating the molding compound. In an embodiment, the singulating is performed using an additional blade, and throughout the singulating, the additional blade is spaced apart from the plurality of organic layers. In an embodiment, the singulating is performed using laser.

In accordance with some embodiments of the present disclosure, a method comprises molding a first device die and a second device die in a molding compound, wherein the molding compound comprises a first base material and first filler particles mixed in the first base material; performing a precutting process using a blade, wherein the blade penetrates through a plurality of polymer layers that are joined to the molding compound, and extends into the molding compound, and the blade cuts some of the first filler particles to form partial particles; after the precutting process, sawing through the molding compound to separate the first device die and the second device die into a first package and a second package; bonding the first package to a package component; and applying an underfill into a gap between the first package and the package component, wherein the underfill comprises a second base material and second filler particles mixed in the second base material, and wherein the underfill is in physical contact with the molding compound. In an embodiment, the first filler particles and the second filler particles are inorganic particles. In an embodiment, the second filler particles are in physical contact with the partial particles. In an embodiment, the precutting process results in a U-shaped or V-shaped trench extending partially into the molding compound.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   forming an interconnect component comprising:
      a plurality of dielectric layers, wherein the plurality of dielectric layers comprise an organic dielectric material; and
      a plurality of redistribution lines extending into the plurality of dielectric layers;
   bonding a first package component and a second package component to the interconnect component;
   encapsulating the first package component and the second package component in an encapsulant;
   precutting the interconnect component to form a trench, wherein the trench penetrates through the interconnect component, and partially extends into the encapsulant, and wherein the precutting comprises:
      performing a first precutting process using laser to form the trench; and
      performing a second precutting process using a blade, wherein the second precutting process further cuts through the trench; and
   performing a singulation process to separate the first package component and the second package component into a first package and a second package, respectively.

2. The method of claim 1, wherein the trench formed by the precutting has a U-shape in a cross-section.

3. The method of claim 1, wherein the trench formed by the precutting has a V-shape in a cross-section.

4. The method of claim 1, wherein in the singulation process, a corresponding kerf is spaced apart from closest edges of the plurality of dielectric layers.

5. The method of claim 1, wherein the organic dielectric material comprises polyimide.

6. The method of claim 1 further comprising:
   bonding the first package with a package substrate; and
   dispensing an underfill between the first package and the package substrate, wherein the underfill physically contacts a surface of the encapsulant, wherein the surface is generated by the precutting.

7. A method comprising:
   forming a plurality of organic layers over a carrier;
   forming a plurality of redistribution lines in the plurality of organic layers;
   attaching a top die over the plurality of redistribution lines;
   dispensing an underfill into a gap between the plurality of redistribution lines and the top die;
   applying a molding compound over the underfill and the plurality of organic layers;
   detaching the carrier from the plurality of organic layers;
   precutting the plurality of organic layers and the molding compound, wherein the precutting comprises:
      performing a first precutting process; and
      after the first precutting process, performing a second precutting process, wherein kerfs of the first precutting process and the second precutting process have an overlap; and
   after the precutting, singulating the molding compound, wherein the precutting and the singulating are performed from a same side of the molding compound.

8. The method of claim 7, wherein the plurality of organic layers comprise polyimide.

9. The method of claim 7, wherein the singulating is performed using a blade, and throughout the singulating, the blade is spaced apart from the plurality of organic layers.

10. The method of claim 7, wherein the singulating is performed using laser.

11. A method comprising:
molding a first device die and a second device die in a molding compound, wherein the molding compound comprises a first base material and first filler particles mixed in the first base material;
performing a precutting process using a blade, wherein the blade penetrates through a plurality of polymer layers that are joined to the molding compound, and extends into the molding compound, and the blade cuts some of the first filler particles to form partial particles;
after the precutting process, sawing through the molding compound to separate the first device die and the second device die into a first package and a second package;
bonding the first package to a package component; and
applying an underfill into a gap between the first package and the package component, wherein the underfill comprises a second base material and second filler particles mixed in the second base material, and wherein the underfill is in physical contact with the molding compound.

12. The method of claim 11, wherein the first filler particles and the second filler particles are inorganic particles.

13. The method of claim 11, wherein the second filler particles are in physical contact with the partial particles.

14. The method of claim 1, wherein the plurality of dielectric layers and the plurality of redistribution lines are pre-formed as parts of the interconnect component, and wherein the first package component and the second package component are bonded to the interconnect component that have been pre-formed.

15. The method of claim 7, wherein the plurality of organic layers and the plurality of redistribution lines are pre-formed as parts of an interconnect component, and wherein the top die is bonded to the interconnect component that have been pre-formed.

16. The method of claim 11, wherein the precutting process and the sawing are performed from a same side of the molding compound.

17. The method of claim 1, wherein the second precutting process is performed with a kerf passing through a center of the trench.

18. The method of claim 7, wherein the first precutting process is performed through laser cutting, and the second precutting process is performed through blade cutting.

19. The method of claim 7, wherein the kerfs of the first precutting process and the second precutting process partially overlap.

20. The method of claim 11 further comprising, before the precutting process using the blade is performed, performing an additional precutting process using laser.

* * * * *